United States Patent [19]
Tsuru et al.

[11] Patent Number: 5,596,243
[45] Date of Patent: Jan. 21, 1997

[54] CRYSTAL OSCILLATOR

[75] Inventors: Yoshikazu Tsuru, Nishinomiya; Sinji Itamochi, Osaka; Junji Ohishi, Sennan; Tetsuro Shimamura, Kyoto; Hiroshi Tahara, Osaka, all of Japan

[73] Assignee: Matsushita Electric Industrial Co., Ltd., Osaka, Japan

[21] Appl. No.: 318,336

[22] Filed: Oct. 5, 1994

[30] Foreign Application Priority Data

Oct. 6, 1993 [JP] Japan .................... 5-250457

[51] Int. Cl.$^6$ ................................. H01L 41/08
[52] U.S. Cl. .................. 310/348; 310/361; 310/346; 310/351; 310/370
[58] Field of Search .................... 310/321, 340, 310/348, 361, 351, 370

[56] References Cited

U.S. PATENT DOCUMENTS

| | | | |
|---|---|---|---|
| 4,362,961 | 12/1982 | Gerber | 310/370 |
| 4,421,621 | 12/1983 | Fujii et al. | 310/361 |
| 4,445,256 | 5/1984 | Huquenin et al. | 310/348 |
| 4,451,754 | 5/1984 | Stolz et al. | 310/348 |
| 4,763,078 | 8/1988 | Williams | 324/458 |
| 5,101,669 | 4/1992 | Holm-Kennedy et al. | 73/862.64 |

FOREIGN PATENT DOCUMENTS

| | | | |
|---|---|---|---|
| 2547458 | 12/1984 | France | 310/346 |
| 0098793 | 8/1978 | Japan | 310/348 |
| 0038748 | 3/1980 | Japan | 310/370 |
| 0202508 | 9/1986 | Japan | 310/351 |
| 62-27040 | 6/1987 | Japan | 310/346 |
| 0122148 | 11/1988 | Japan | 310/346 |
| 2202989 | 10/1988 | United Kingdom | 310/348 |

*Primary Examiner*—Thomas M. Dougherty
*Attorney, Agent, or Firm*—McDermott, Will & Emery

[57] ABSTRACT

The invention is a crystal oscillator having a vibrating plate comprising a vibrating part surrounded by a rim part spaced from the vibrating part except for a narrow connecting part that connects the vibrating part to the rim part in a cantilever fashion. The thickness of the vibrating part and the connecting part are less than the thickness of the rim part. The vibrating part is sandwiched between a pair of casings. Each of the casings has a recess facing the vibrating part, which prevent the vibrating part from contacting the casings. Each surface facing a recess has an electrode positioned thereon and an electrode lead extending from the surface electrode to the connecting part. Each casing has a through-hole positioned to face an electrical lead. A cup-shaped metal lead is placed in each through-hole with the bottom of the cup contacting the electrical lead facing the through-hole. Current to the surface electrodes is supplied through the metal leads.

16 Claims, 5 Drawing Sheets

CRYSTAL OSCILLATOR

BACKGROUND OF THE INVENTION

The present invention relates to crystal oscillators for use in electronic equipment such as communication devices.

Turning now to FIGS. 8 and 9, there is shown a conventional crystal oscillator 90 comprises a casing or housing 51 having a recess 52. A vibrating plate 53 is housed within the recess 52. The right edge 54 of the plate 53 is fixed or mounted within the recess 52 to the housing 51 by means of conductive adhesive layers 55, 56. The vibrating plate is sandwiched between a pair of electrodes 57, 58. A right-side electrical terminal 59 and a left-side electrical terminal 60 are formed on the surfaces of the housing 51. The conductive layer 55 is used to electrically connect the upper electrode 57 to the right-side electrical terminal 59. The conductive layer 56 is used to electrically connect the lower electrode 58 to the left-side electrical terminal 60. An upper casing or plate 61 is bonded to the upper surface 62 of the lower housing 51 sealing the vibrating plate 53 mounted in the recess of said lower housing.

The dimensions of the conventional crystal oscillator 90 shown in FIGS. 8 and 9 are small. As a result, extreme care must be used in mounting the vibrating plate 53 in an exact position within the recess 52. Unless extreme care is used in mounting the vibrating plate 53, the plate may be improperly attached to or misaligned in the lower housing 51, causing the vibrating plate 53 to contact the lower housing 51 or the upper plate 61 thereby, producing unstable or irregular oscillations of the vibrating plate 53.

The process of fabricating the conventional crystal oscillator 90 is further complicated by the plurality of bends required to form the right and left-side electrical terminals to provide continuous connections from the adhesive layers 55, 56 within the recess 52 to the external side surfaces of the lower housing 51.

SUMMARY OF THE INVENTION

According to the invention, a crystal oscillator is provided comprising a vibrating plate sandwiched between an upper and a lower casing. The vibrating plate includes a vibrating part surrounded by a rim with a fine slit in between the vibrating part and the rim except for a relatively narrow part that connects the vibrating part to the rim part.

The thicknesses of the vibrating part and the connecting part are thinner than the thickness of the rim part. Opposite surfaces of the vibrating part are provided with an electrode. An electrical lead extends from each surface electrode onto the connecting part.

Each of the casings has a recess facing the vibrating part and a through-hole positioned to face an electrical lead on the surface of the connecting part.

A cup-shaped metal lead is fabricated in each through-hole by depositing metal particles in the through-hole using a vacuum evaporation or a sputtering method. The bottom of the cup-shaped metal lead is fixed to the electrical lead facing the through-hole containing the metal lead to provide an electrical connection to the electrical lead on the connecting part.

Terminals are positioned at opposite ends of the crystal oscillator with each terminal being in electrical contact with a metal lead. Current can be provided to the surface electrodes of the vibrating part through the terminals to the metal leads.

Preferably, the crystal oscillator is formed by providing a first plate having a central portion, a peripheral portion having a rim surrounding the central portion at a distance therefrom, and a relatively narrow connecting portion connecting said central portion to said peripheral portion; forming a first electrode on a first surface of said central portion; forming an electrical lead on a first surface of said connecting portion and connecting said electrical lead to said first electrode; forming a second electrode on a second surface of said central portion opposite to said first surface; forming a second electrical lead on a second surface of said connecting portion and connecting said second electrical lead to said second surface electrode; forming a second plate with a recess for covering said second surface of said first plate and with a through-hole for facing said second electrical lead; forming a third plate with a recess for covering said first surface of said first plate and with a through-hole for facing said first electrical lead; mirror finishing a surface of said second plate on the same side as said recess in said second plate; mirror finishing said rim of said first plate on the same side as said second surface; covering said recess in said second plate with said second surface of said first plate; pressing said first plate to said second plate and applying heat thereto to bond the first and second plates together; adjusting the frequency of said central portion by trimming said central portion; mirror finishing a surface of said third plate on the same side as said recess in said third plate; mirror finishing said rim of said first plate on the same side as said first surface; covering said recess in said third plate with said first surface of said first plate; and pressing said third plate to said first plate and applying heat thereto to bond the first and third plates together; wherein the three plates are integrated together to form a crystal oscillator.

DETAILED DESCRIPTION OF THE EMBODIMENTS

Figure 1:
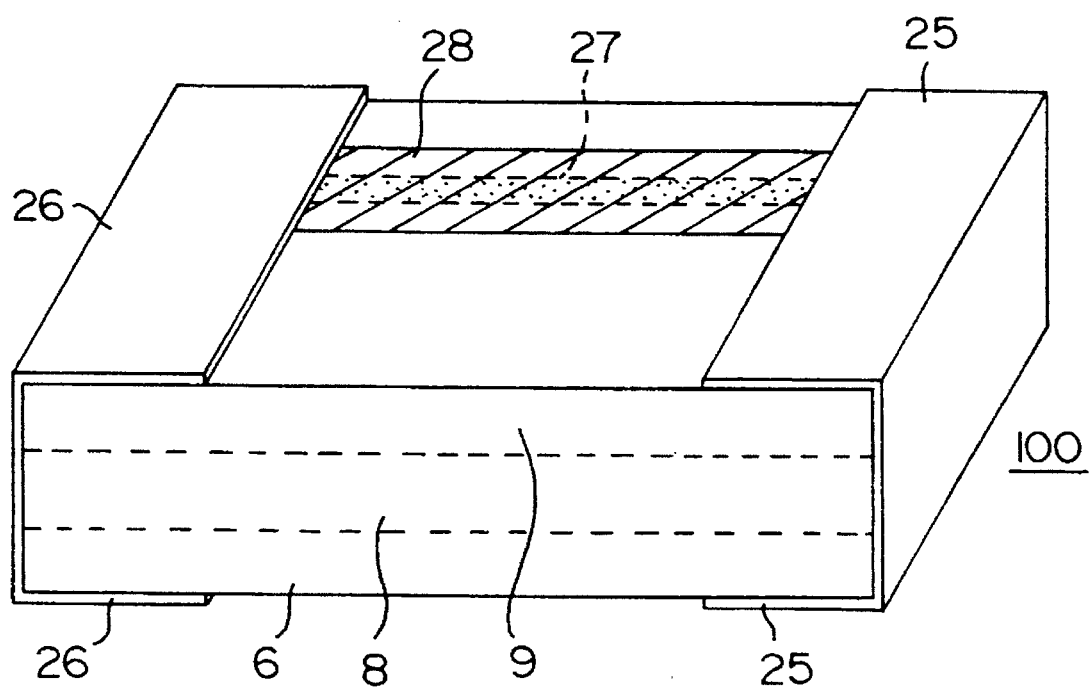
FIG. 1 is a perspective view of a first embodiment of the crystal oscillator.

Hereinafter, a crystal oscillator 100 of the present invention will be described by referring to FIGS. 1–7. In FIGS. 1–7, elements having the same function are identified with the same number.

FIRST EMBODIMENT

Referring now to the drawings, a first embodiment of a crystal oscillator 100 of the present invention is illustrated in FIGS. 1, 2, 3 and 4 as having three plates, components, or sections 6, 8, 9 of a rectangular shape and a pair of terminals 25, 26. All three plates 6, 8, 9 are made from the same material, such as quartz crystal.

One of the plates is identified as a lower casing or housing 6 having a recess 7 and a through-hole 18.

The intermediate plate is a vibrating plate 8 having a rim part or peripheral portion 10, and a vibrating part or central portion 12. The peripheral portion 10 surrounds the central portion 12 and is spaced therefrom by a slit part 13 except for a narrow connecting portion 11 connecting the vibrating central portion 12 to the rim or peripheral portion 10 in a cantilever fashion within the rim part 10.

The third plate is an upper rectangular casing or housing 9. The upper rectangular plate 9 also has a recess (not shown), similar to the recess 7, and a through-hole 19.

The vibrating plate 8 is formed using an etching or sandblasting method. The width of the connecting portion 11 is made narrower than the width of the vibrating part or central portion 12 so that very little of the vibration generated by the vibrating part 12 is transmitted to the connecting part 11. Also, the thickness of the vibrating part 12 and the connecting part 11 are made less than the thickness of the rim part 10 by grinding, etching or sand-blasting off the surface of the vibrating and connecting parts.

The upper surface of the vibrating part 12 is provided with an upper electrode 14. The lower surface of the vibrating part is provided with a lower electrode 15. Both electrodes are provided with electrical leads 16, 17 extending from the electrodes 14, 15 on the vibrating part onto a surface of the connecting part 11 close to the rim part 10 of the vibrating plate 8. The electrodes 14, 15 and electrical leads 16, 17 are usually fabricated by a gold deposition method. The surfaces of the vibrating part 12 are ground sufficiently so that the thickness of the vibrating plate 12 and the upper and lower electrodes 14, 15 is less than the thickness of the rim part 10.

As described above, vibrating plate 8 comprises a rim part 10, a vibrating part 12 surrounded by a rim part 10 and a slit part 13 formed within rim part 10, and a relatively narrow connecting part 11 connecting vibrating part 12 to rim part 10. The vibrating plate 8 is made as one body by the same material. Therefore, the relative position of vibrating part 12 to rim part 10 is fixed, so that the possibility of contact of vibrating part 12 to rim part 10 can be avoided.

The recess 7 in the lower casing 6 provides a still larger distance between the vibrating part 12 and the lower casing. In a similar manner, the recess (not shown) in the upper casing 9 also separates the vibrating part 12 further from the upper casing 9.

The three plates 6, 8, 9 are mounted in tandem in a vertically abutting relationship with the upper plate 9 disposed on the vibrating plate 8, and this latter vibrating plate 8 disposed on the lower housing 6.

The process for stacking the three plates 6, 8, 9 is now described. First, adjacent surfaces of the vibrating plate 8 and the lower plate 6 are mirror finished. The rectangular vibrating plate 8 is placed on the lower plate 6, and is pressed against the lower plate while heat is applied thereto. Since both plates 6, 8 are made of quartz crystal, heating the two parts activates the atomic bonding to firmly integrate the surface of the lower plate 6 to the surface of the rim part 10.

Next, the oscillating frequency of the vibrating part 12 is calibrated. An electrical signal is placed across the upper and lower electrodes 14, 15. The signal is applied to the upper electrical lead 16 directly. The signal is applied to the lower electrode 15 through the lower through-hole 18 of the lower casing 6 to the lower electrical lead 17. The oscillating frequency is measured and is adjusted to the desired frequency by trimming the material of the vibrating part 12.

Next, the adjacent surfaces of the upper plate 9 and the rim part 10 are mirror finished. The upper plate 9 is stacked on the vibrating plate 8. Pressure and heat are applied and the plates 8, 9 are bonded together by the atomic bonding force acting between these two components.

The process described above sandwiches the vibrating plate 8 between the upper 9 and lower 6 plates and integrates the three plates together.

Figure 4:
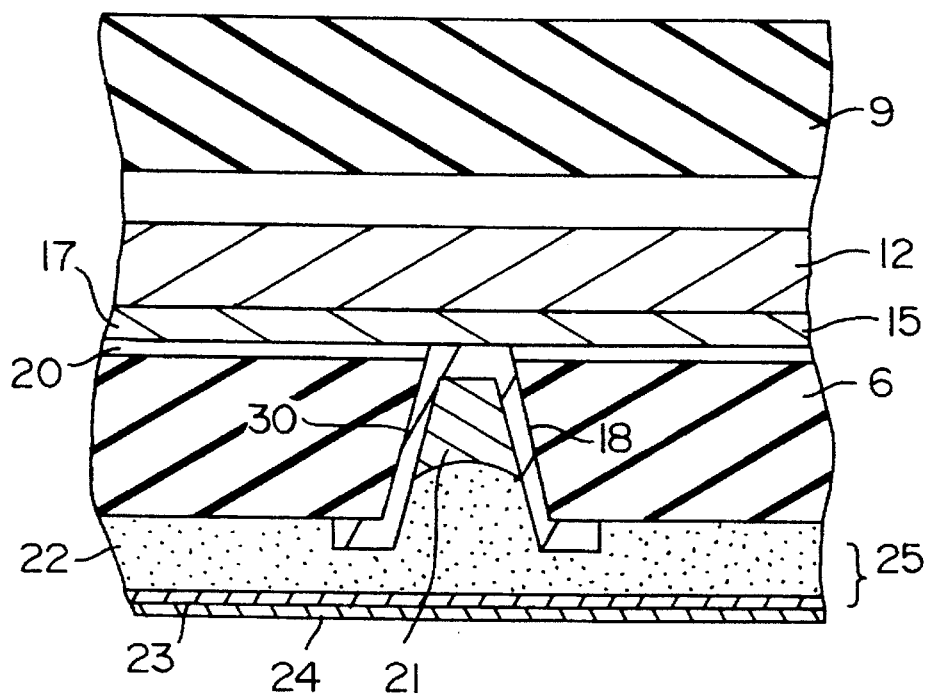
FIG. 4 is a partial cross-sectional view of the crystal oscillator shown in FIG. 2 in the region of an assembled through-hole.

Two U-shaped right-side 25 and left-side 26 electrical terminals are then formed on the outer edge of the crystal oscillator as shown in FIG. 1. As shown in FIG. 4, each U-shaped terminal 25, 26 consists of a printed silver-paste layer 22, a nickel-plated layer 23, and a solder-plated layer 24.

Now the process for attaching the terminals 25, 26 to the integrated or assembled plates 6, 8, 9 and the process of filling the through-holes 18, 19 to provide electrical connections between the leads 16, 17 of the electrodes 14, 15 and the terminals 25, 26 is described.

Referring to FIG. 4, this figure shows an exploded cross-section of the region around the lower through-hole 18, including portions of the three plates 6, 8, 9.

The process for fabricating the electrical connection is as follows. Vacuum deposition or sputtering is used to evaporate metal particles on the inner wall of the through-hole 18 from the bottom to top in an upward direction. The metal particles deposited on the inner wall of hole 18 form a lower cup-shaped metal lead 30. The metal particles are deposited up to the surface of the electrical lead 17 of the electrode 15. As a result, the gap 20 between the lower plate 6 and the lower electrical lead 17 is filled with the metal particles evaporated on the inner wall of the hole 18. The lower through-hole 18 is sealed completely by the lower metal lead 30.

By way of example, the following details of construction of the electrical connection are provided in order to better define the structure of the electrical connection between the lead 17 and the terminal 25. Since the inner wall of the lower through-hole 18 is vertical, it is somewhat awkward to deposit metal particles on a vertical inner wall. This problem is lessened if a tapered through-hole is used. Specifically, the number of metal particles that can be deposited on the inner wall of a through-hole is increased if a tapered through-hole, such as shown in FIG. 4 is used. In such a case, with a gap 20 of 2000 •, the thickness of the material filling the gap and extending into the through-hole 18 is about 6000 •. The thickness of the tapered metal layer deposited on the tapered wall of the through-hole 18 is about 2000 •.

In order to ensure a reliable seal in the lower through-hole 18 by the lower metal lead 30, sealing glass 21 can be added to the metal lead 30. However, a reliable seal can also be ensured by adding silver-paste 22 into the lower metal lead 30 in place of the sealing glass 21. The use of silver-paste has the advantage of reducing the failure of the crystal oscillator by an electrical disconnection of the metal lead due to the difficulty of depositing metal particles on the inner wall of a through-hole.

The electrical connection between the lead 17 through the lower metal lead 30 to the terminal 25 is established through the silver-paste layer in the terminal 25.

The upper metal lead 31 (not shown) is constructed identically to the lower metal lead 30 and hence, its explanation is omitted here. However, the electrical connection between the upper metal lead 31 and the terminal 26 is different since the terminal 26 is located on the edge of the crystal oscillator opposite from edge on which the terminal 25 is formed.

Figure 2:
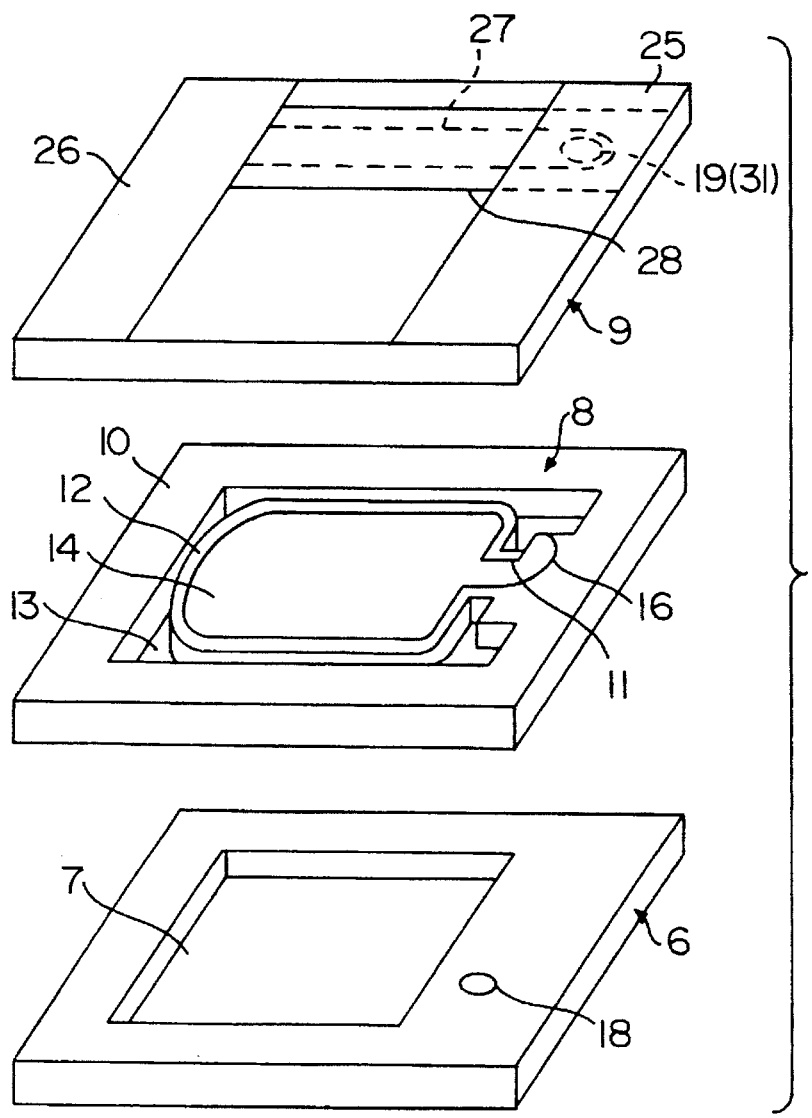
FIG. 2 is an exploded perspective view of the upper casing, the vibrating plate and the lower casing of the crystal oscillator shown in FIG. 1.
Figure 3:
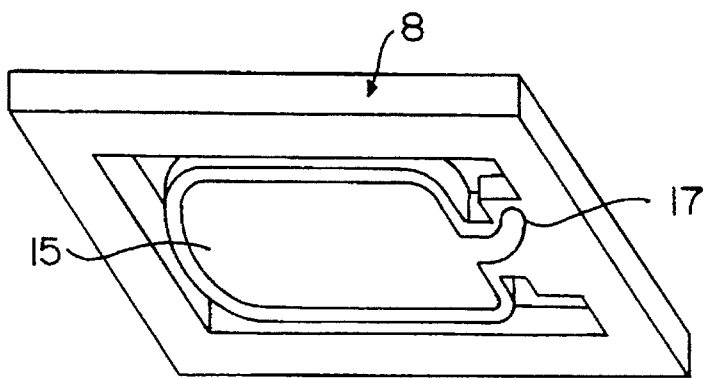
FIG. 3 is a bottom view of the vibrating plate shown in FIG. 2.

FIG. 2 shows a connection between the upper metal lead 31 deposited in the through-hole 19 of the upper plate 9 and the left-side electrical terminal 26. In this case, the connection of the upper metal lead 31 is accomplished through a conductive pattern or layer 27 formed on the upper plate 9. A glass layer 28 is formed on the conductive layer 27 and acts as an insulating layer. The right side terminal 25 is insulated from the upper metal lead 31 by the glass insulating layer 28. The conductive layer 27 contacts the metal layer 31 and the left-side electrical terminal 26.

SECOND EMBODIMENT

Figure 5:
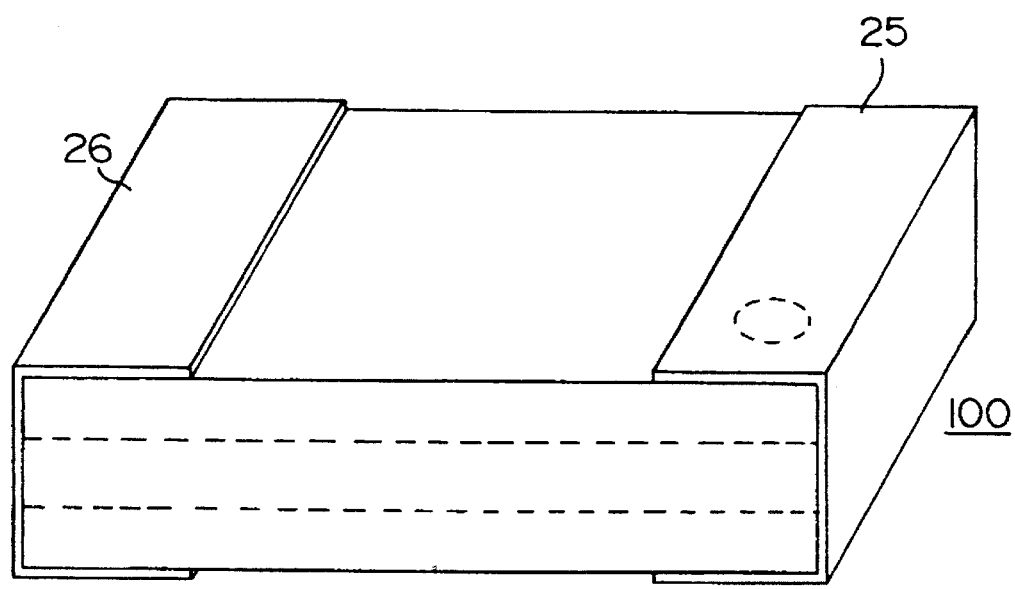
FIG. 5 is a perspective view of a second embodiment of the crystal oscillator.
Figure 6:
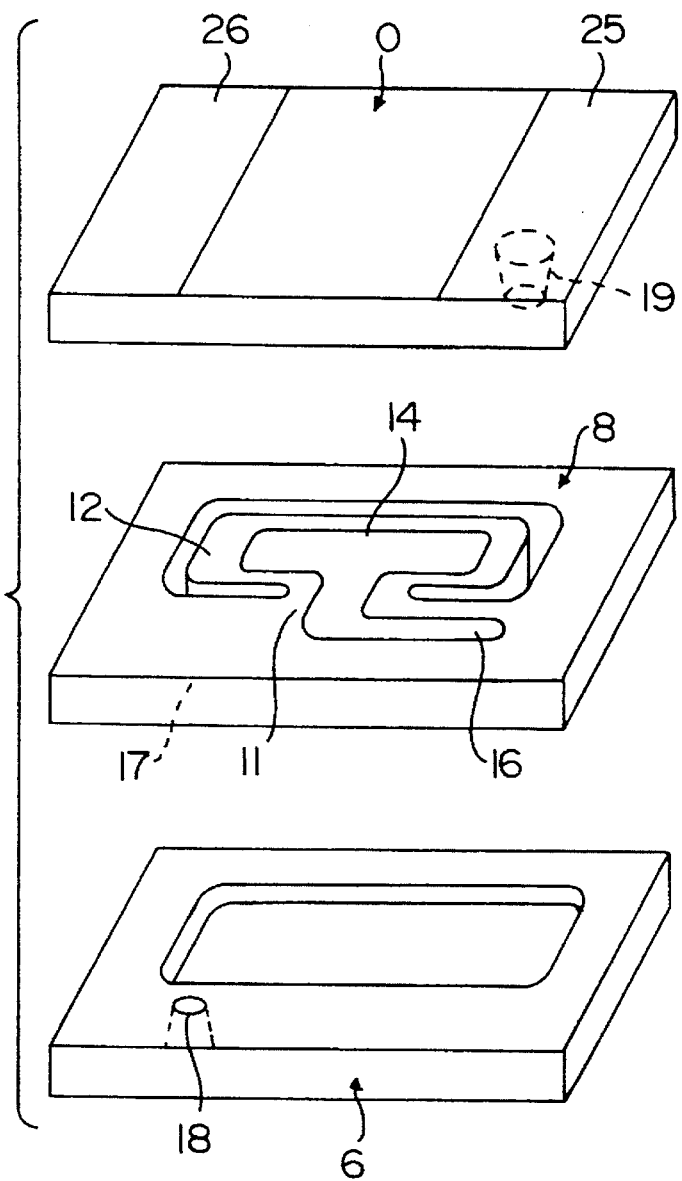
FIG. 6 is an exploded perspective view of the upper casing, the vibrating plate, and the lower casing of the crystal oscillator shown in FIG. 5.
Figure 7:
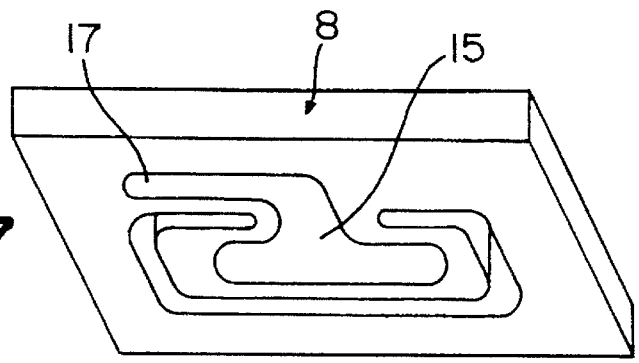
FIG. 7 is a bottom view of the vibrating part shown in FIG. 6.
Figure 8:
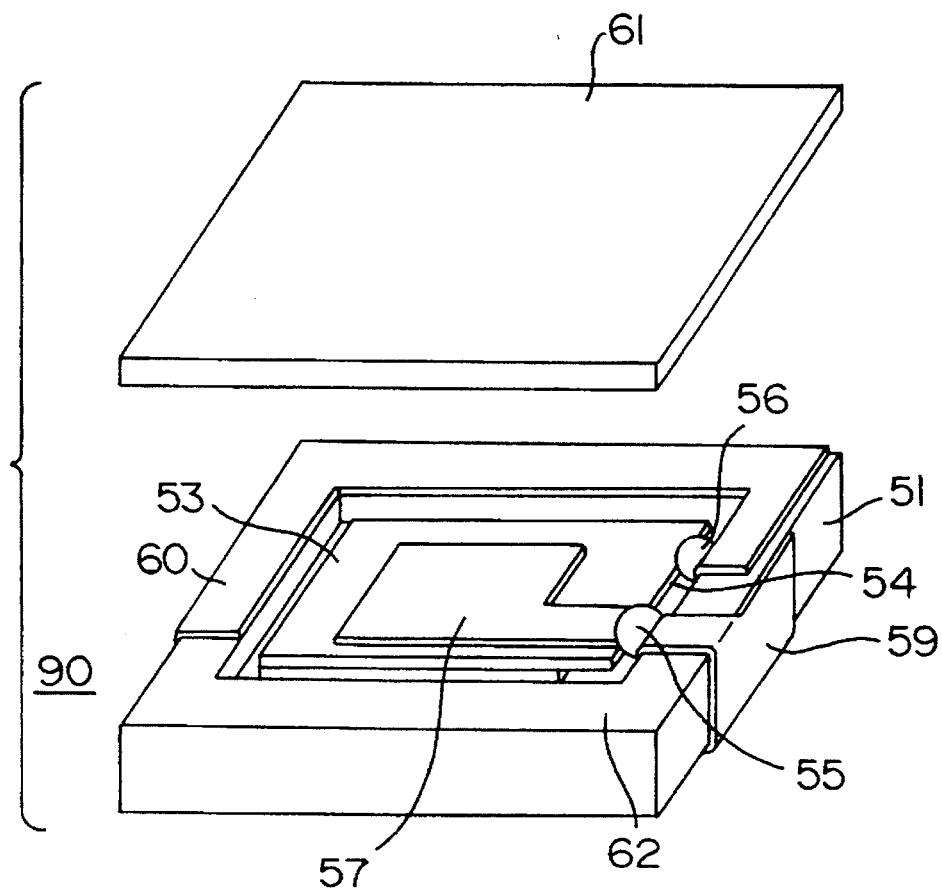
FIG. 8 is an exploded perspective view of a conventional crystal oscillator.
Figure 9:
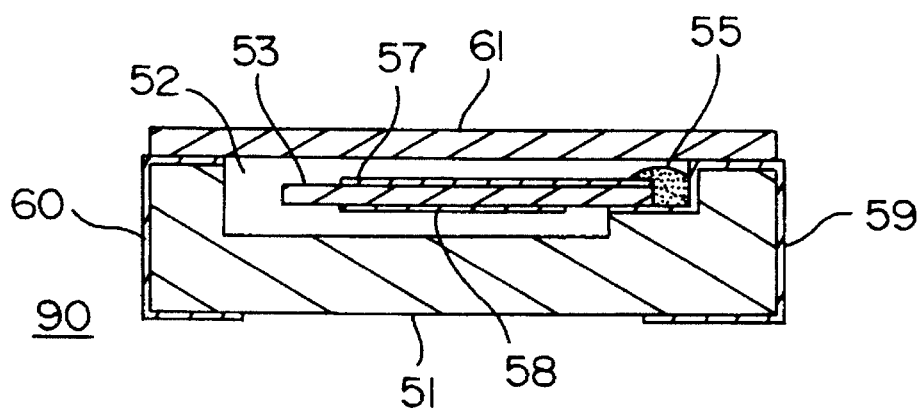
FIG. 9 is a cross-sectional view of the assembled conventional oscillator shown in FIG. 8.

A second embodiment of a crystal oscillator is shown in FIGS. 5, 6 and 7. The crystal oscillator shown in FIG. 6 is very similar to the oscillator shown in FIG. 2. A difference between the two embodiments is found in the position of the connecting part 11.

In the second embodiment, the connecting part 11 is positioned at the center of the longer edge of the rectangular vibrating plate 8. Also, the vibrating part 12 is supported at its longer edge in a cantilever fashion. The upper electrical lead 16, extends from the upper electrode 14, towards the lower edge of the vibrating plate 8 and bends towards the shorter edge of the vibrating plate 8. The lower electrical lead 17 extends from the lower electrode 15 and also extends towards the longer edge of the vibrating plate 8. However, the lower electrical lead bends toward the other shorter edge of the vibrating plate 8, as shown in FIG. 7.

The second embodiment has the advantage over the first embodiment in that it is simpler to construct. The second embodiment does not need the conductive pattern 27 and the insulating layer 28. The upper electrical lead 16 is connected to the right-side terminal 25 using the through-hole 19 and the metal lead therein in the upper casing 9. The lower electrical lead 17 is connected to the left-side terminal 26 using the through-hole 18 and the metal lead therein in the lower casing 6.

Variations to the embodiments described above are possible. For example, the shape of the plates 6, 8, 9 is described as nearly rectangular or rectangular. The shape of the components may be modified to be square or other common geometrical shape (or otherwise modified) to provide the intended function.

It should be recognized that the vibrating plate 8 is made as one body with the same material. Therefore, the relative position of the vibrating part 12 to the rim part 10 is fixed. This construction provides the advantage of avoiding contact between the vibrating part 12 with the rim part 10. Moreover, since the thicknesses of vibrating part 12 and connecting part 11, including the thicknesses of the electrodes 14, 15 and the electrical leads 16, 17, are made less than the thickness of the rim part 10, vibrating part 12 is prevented from contacting the upper casing 9 or lower casing 6 even when the vibrating part 12 is in a vibrating mode.

As a result, the crystal oscillator of this invention provides the excellent advantage of ensuring that the vibrating part 12 will not contact any other parts of the crystal oscillator.

Further, recesses are provided in each of the casings 6, 9 in order to provide still a larger distance between the vibrating part 12 and the casings 6, 9. The recesses provide the advantage that if the depth of each recess is made deep enough, there is no need to make the thickness of the vibrating part 12 less than the thickness of the rim part.

Of course, it should be understood that a wide range of changes and modifications can be made to the preferred embodiment described above. It is therefore intended that the foregoing detailed description be regarded as illustrative rather than limiting, and that it be understood that it is the following claims, including all equivalents, which are intended to define the scope of this invention.

What is claimed is:

1. A crystal oscillator comprising:

a first quartz crystal plate having a central portion, a peripheral portion forming a rim that surrounds the central portion at a distance therefrom, and a relatively narrow connecting portion connecting said central portion to said peripheral portion;

an electrode formed on a first surface of said central portion and on a portion of a first surface of said connecting portion;

another electrode formed on a second surface of said central portion opposite to said first surface and on a portion of a second surface of said connecting portion opposite to said first surface of said rim;

a second quartz crystal plate having a central portion and a peripheral portion disposed over said first surface of said first plate, said first and second plates being firmly integrated at the peripheral portions by atomic bonding; and a third quartz crystal plate having a central portion and a peripheral portion disposed over said second surface of said first plate, said first and third plates being firmly integrated at the peripheral portions by atomic bonding, wherein said electrodes are for receiving an electrical signal to vibrate said central portion at a specific frequency.

2. A crystal oscillator according to claim 1, wherein the first plate defines a thickness of said central portion to be less than the thickness of said peripheral portion for preventing said central portion from contacting said second plate or said third plate.

3. A crystal oscillator according to claim 1, wherein said second plate has a recess facing said first surface of said central portion and said third plate has a recess facing said second surface of said central portion for preventing said central portion from contacting said first plate or said second plate.

4. A crystal oscillator according to claim 2, wherein the width of said connecting portion is narrower than the width of said central portion for preventing vibration generated by said central portion from being transmitted to said connecting portion.

5. A crystal oscillator according to claim 1, wherein said first, second and third plates are rectangular in shape.

6. A crystal oscillator according to claim 5, wherein said central portion is nearly rectangular, and a longer side of said central portion is connected to said peripheral portion in a cantilever fashion by said connecting portion.

7. A crystal oscillator according to claim 5, wherein said central portion is nearly rectangular, and a shorter side of said central portion is connected to said peripheral portion in a cantilever fashion by said connecting portion.

8. A crystal oscillator comprising:

a quartz crystal vibrating plate with an upper and a lower surface, comprising;

a rim part, a vibrating part having an upper surface and a lower opposite surface surrounded by said rim part with a slit part provided between said vibrating part and said rim part, and a relatively narrow connecting part having an upper surface and lower opposite surface connecting said rim part to said vibrating part, all of which parts are made as one body by a same material;

an electrode positioned on said upper surface of said vibrating part;

an upper electrical lead positioned on said upper surface of said connecting part electrically connected to said upper electrode;

a lower electrode positioned on said lower surface of said vibrating part;

a lower electrical lead positioned on said lower surface of said connecting part electrically connected to said lower electrode;

an quartz crystal upper casing having a rim part covering said upper surface of said vibrating plate, said upper casing and said vibrating plate being firmly integrated at the rim parts by atomic bonding;

a quartz crystal lower casing having a rim part covering said lower surface of said vibrating plate, said lower casing and said vibrating plate being firmly integrated at the rim parts by atomic bonding;

an upper through-hole passing through said upper casing;

a lower through-hole passing through said lower casing;

an upper metal lead electrically connected to said upper electrical lead through said upper through-hole;

a lower metal lead electrically connected to said lower electrical lead through said lower through-hole;

an electric terminal fixed on an end of a casing and electrically connected to said upper metal lead; and another electric terminal fixed on another end of a casing and electrically connected to said lower metal lead, wherein said terminals are for receiving an electrical signal to vibrate said vibrating part at a specific frequency.

9. A crystal oscillator according to claim 8, wherein said through-holes are tapered holes.

10. A crystal oscillator according to claim 8, wherein said metal lead is cup-shaped, and its external surface is firmly fixed on the inner wall of said through-hole.

11. A crystal oscillator according to claim 10, wherein said cup-shaped metal lead is at least partially filled with a glass material.

12. A crystal oscillator according to claim 10, wherein said cup-shaped metal lead is at least partially filled with a metal material constituting said electrical terminal.

13. A crystal oscillator according to claim 8, wherein said crystal oscillator has a rectangular shape.

14. A crystal oscillator according to claim 8, wherein the thickness of said vibrating part is less than the thickness of said rim part.

15. A crystal oscillator according to claim 8, wherein said vibrating part is nearly rectangular, and the longer side of said vibrating part is connected to said rim part in a cantilever fashion by means of said connecting part.

16. A crystal oscillator according to claim 8, wherein said vibrating part is nearly rectangular, and the shorter side of said vibrating part is connected to said rim part in a cantilever fashion by means of said connecting part.

* * * * *